United States Patent [19]

Coldren

[11] 4,252,864
[45] Feb. 24, 1981

[54] LEAD FRAME HAVING INTEGRAL TERMINAL TABS

[75] Inventor: Daniel R. Coldren, Enola, Pa.

[73] Assignee: AMP Incorporated, Harrisburg, Pa.

[21] Appl. No.: 90,945

[22] Filed: Nov. 5, 1979

Related U.S. Application Data

[63] Continuation of Ser. No. 949,585, Oct. 10, 1978, abandoned.

[51] Int. Cl.³ .................. H01R 9/00; H01L 24/48
[52] U.S. Cl. .................. 428/571; 174/52 FP; 339/17 CF; 357/70
[58] Field of Search .............. 428/571, 583, 595; 357/69, 70; 174/52 FP; 339/258 S, 147, 176 MP, 17 CF

[56] References Cited

U.S. PATENT DOCUMENTS

| | | | |
|---|---|---|---|
| 3,426,252 | 2/1969 | Lepselter | 317/234 |
| 3,431,092 | 3/1969 | Lehner | 428/571 |
| 3,569,797 | 3/1971 | Simmons | 357/70 X |
| 3,597,666 | 8/1971 | Taskovich | 357/70 |
| 3,650,232 | 3/1972 | Heinlen | 174/52 FP |
| 3,727,175 | 4/1973 | Grenda | 339/176 MP X |
| 3,735,017 | 5/1973 | Manning | 174/52 FP |
| 3,736,367 | 5/1973 | Heinlen | 174/52 FP |
| 3,821,615 | 6/1974 | Nordstrom | 357/70 |
| 3,910,671 | 10/1975 | Townsend | 339/258 S X |
| 4,158,745 | 6/1979 | Keller | 174/52 FP |

OTHER PUBLICATIONS

General Electric Drawing, 118 C 8332.
General Electric Drawing, 138 B 8477.

*Primary Examiner*—John McQuade
*Assistant Examiner*—John S. Brown
*Attorney, Agent, or Firm*—Frederick W. Raring

[57] ABSTRACT

A continuous strip of stamped and formed lead frames for a semi-conductor chip comprises spaced apart parallel carrier strips with the lead frames connected to one of the carrier strips at regularly spaced intervals. Each lead frame comprises a chip supporting portion which is centrally located between the carrier strips, and second arm which extends from the chip support portion towards one of the carrier strips and first and third arms on each side of the chip support portion which extend towards the other carrier strip. Terminal tabs are provided on each of the arms, the first and third tabs on the first and third arms extending parallel to each other towards the other carrier strip and the tab on the second arm extending parallel to the other tabs and towards the one carrier strip. Each lead frame is secured to the one carrier strip by a connection section extending from the second tab. The chip support portion and the first and third arms are additionally supported by a removable support member extending from the other carrier strip.

4 Claims, 5 Drawing Figures

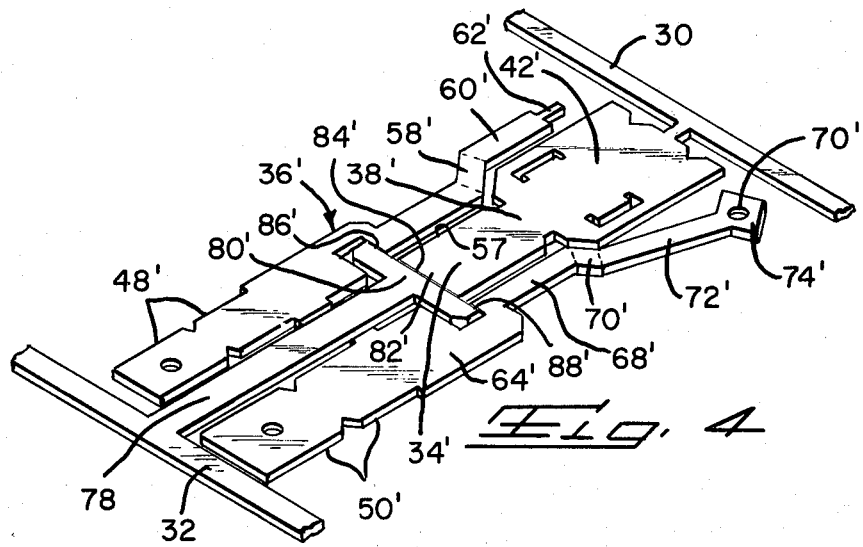
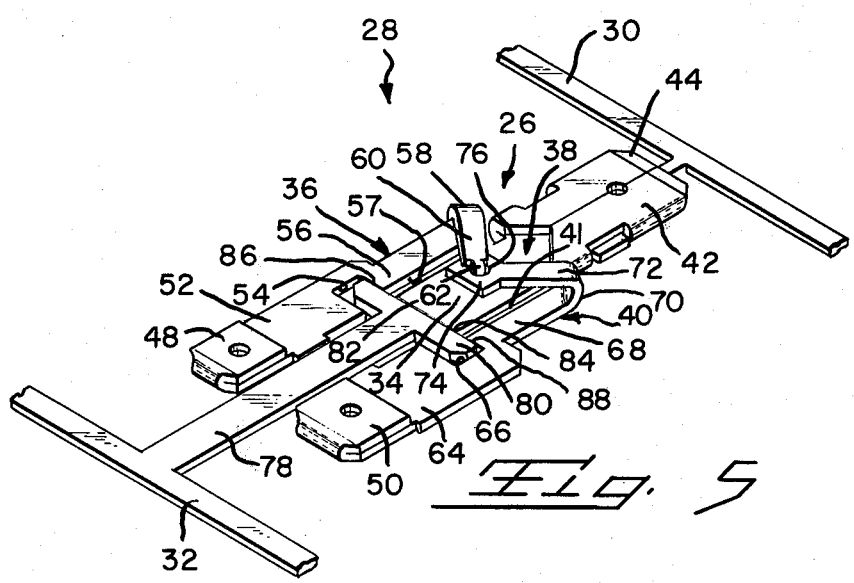

LEAD FRAME HAVING INTEGRAL TERMINAL TABS

This is a continuation of application Ser. No. 949,585, filed Oct. 10, 1978 and now abandoned.

DESCRIPTION

Technical Field of the Invention

This invention relates to lead frames for packaging solid state chips such as triacs or transistors and to packaged chips having integral terminal members connected to the chips for making external connections.

Solid state devices such as transistors and triacs are commonly incorporated into electrical circuits by connecting the contact areas of the chip to sheet metal stamped and formed leads in a lead frame which, in turn, have portions which can be connected to external circuitry. The sheet metal lead frames are produced in endless strip form. The final package for the chip is thus produced by mounting the chip on a chip receiving portion of the lead frame, connecting conductors of the lead frame to the chip, and then encapsulating the chip and portions of the conductors in a suitable insulating material such as an epoxy resin. The portions of the conductors which extend externally of the encapsulating or potting material are then connected to further conductors to connect the encapsulated chip into a circuit.

Usually, solid state devices are incorporated into circuits which are contained on a printed circuit board and the leads which extend from the packaged solid state device are relatively small so that they can be inserted into holes in a printed circuit board and soldered to conductors on the printed circuit board. The electrical connections between the chip and the conductors of the lead frame are commonly made by wires which are bonded to the chip and to the ends of the conductors although some lead frames have been proposed which permit direct bonding of the lead frame to the chip; see, for example, U.S. Pat. Nos. 3,650,232, 3,735,017, and 3,736,367. The lead frames shown in these patents have parallel side-by-side terminal post portions which are dimensioned such that they can be inserted into the holes in a printed ciruit board as mentioned above.

Under some circumstances, solid state chips are used in circuits which are not on printed circuit boards but which are rather composed of conventional insulated wires. For example, there is a trend towards the use of solid state control components in domestic appliances such as washers, dryers, microwave ovens, and conventional ranges. Such appliances reuire insulated wires for many of their elements, such as the heating units, and the control circuits and the electrical connections required for appliances are achieved by means of conventional harnesses composed of insulated wires having disengageable terminals on their ends. Many, if not most, of the prior art packaging methods for solid state chips can not be readily incorporated into appliance harnesses for the reason, as mentioned above, that the packaging methods result in relatively thin leads in the solid state package which are suitable only for use on printed circuit boards.

U.S. patent application Ser. No. 846,052, filed Oct. 27, 1977, now U.S. Pat. No. 4,158,745, discloses and claims a continuous strip of lead frames having integral terminal tabs disposed in the plane of the strip. When a semi-conductor chip is assembled to one of these lead frames, the terminal tabs are bent so that they extend normally of the plane of the strip and after assembly of a suitable housing and a heat sink to the lead frame, the terminal tabs can be mated with commonly used tabs of quick disconnect terminals on the ends of lead wires thereby to incorporate the semi-conductor in a circuit. The tabs of the lead frames shown in the above identified application are, in the finished packaged semi-conductor device, arranged in a triangular configuration with two of the tabs being opposed to each other in parallel spaced apart planes and with the other tab defining a plane which extends normally of these two parallel planes.

This tab arrangement is a standard one used by many manufacturers of packaged semi-conductor devices, but another tab configuration is also used in which two of the tabs are in coplanar relationship and the remaining tab is in a plane which extends parallel to the plane of the two tabs. The instant invention is directed to the achievement of a lead frame and a lead frame strip which provides the tab configuration of the latter type, that is, with two tabs in side-by-side coplanar relationship and with the third tab in a plane which is parallel to the plane of the two tabs.

The herein disclosed embodiment of the invention comprises spaced-apart carrier strips to which the lead frames are attached at regularly spaced intervals. Each lead frame comprises a chip supporting surface portion which is centrally located between the carrier strips and first, second, and third arms which extend from this chip supporting portion. The second arm extends towards one of the carrier strips and has a formed terminal tab on its end which also extends towards one carrier strip. The end of this second tab is connected to the one carrier strip by a connecting neck. The first and third arms are beside opposite edges of the chip supporting portion and extend towards the other carrier strip. These first and third arms have tabs in their ends which also extend towards the other carrier strip and which are parallel to the second arm and the second tab. Portions of the first and third arms and the chip supporting surface portion are supported in the continuous strip by a chip supporting extension which projects from the other carrier strip. This supporting member is connected to the first and third arms and to the chip supporting portion along weakened severing lines so that it can be severed from the lead frame when the lead frame is assembled to the other parts of a packaged semiconductor device. When the tabs are bent in a common direction normally of the plane of the strip, the first and third terminal tabs will be in coplanar relationship and the second tab will lie in a plane which is parallel to, and spaced from, the plane of the first and third tabs.

DESCRIPTION OF THE DRAWING FIGURES

FIG. 4 is a perspective view of the flat blank from which a lead frame in accordance with the invention is formed.

FIG. 5 is a perspective view of the formed lead frame and illustrating the manner of assembling a chip and a substrate to the lead frame.

PRACTICE OF THE INVENTION

Figure 1:
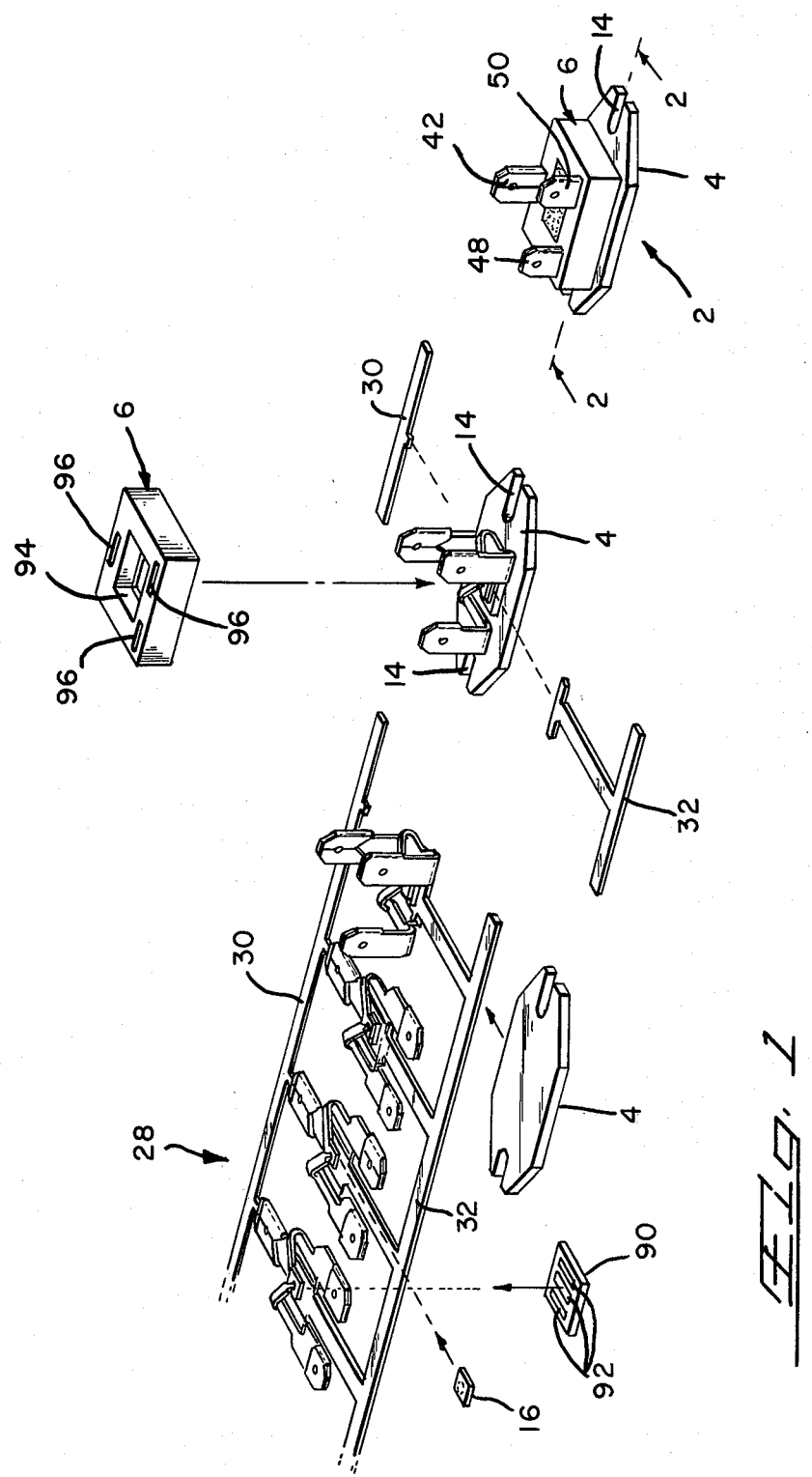
FIG. 1 is a perspective view illustrating the manufacture of lead frame strip in accordance with the invention and the process or method of packaging solid state chips in accordance with the invention.
Figure 2:
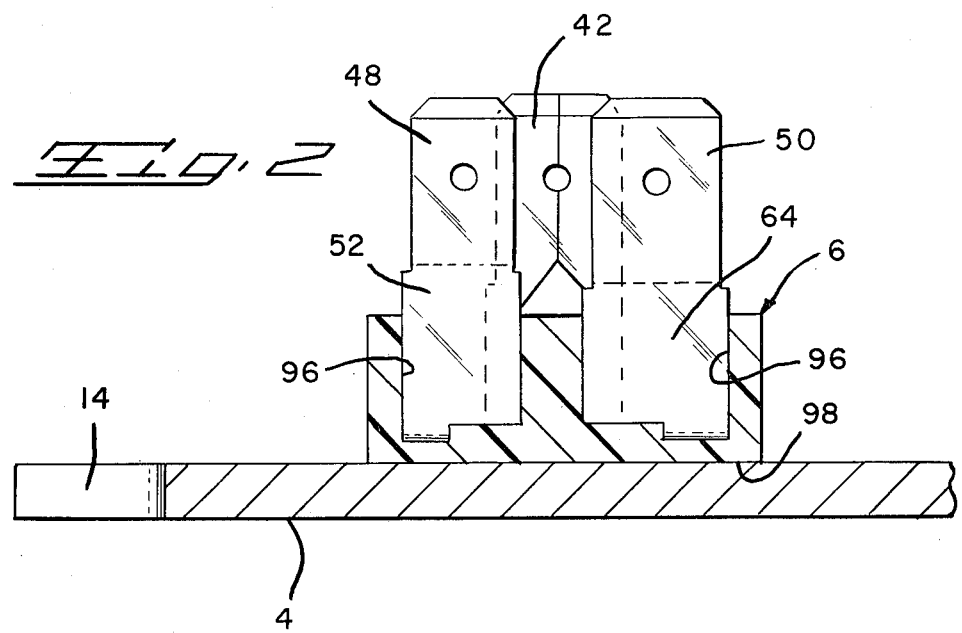
FIG. 2 is a cross-sectional view of a packaged chip taken along the lines 2—2 of FIG. 1.
Figure 3:
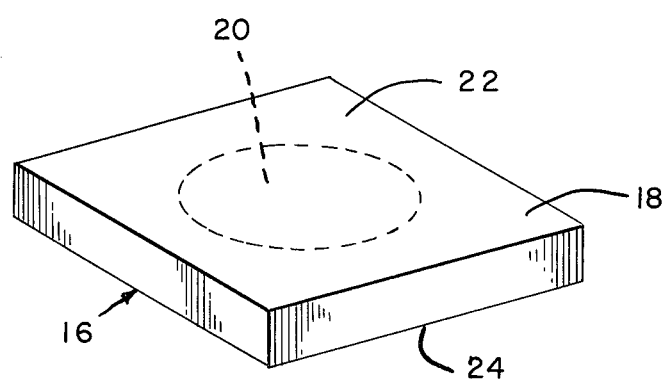
FIG. 3 is a perspective view of a typical chip such as a triac or a transistor.

FIGS. 1 and 2 show a package 2 containing a solid state chip 16 and comprising a relatively massive metallic heat sink 4, a housing and encapsulating assembly 6, and terminal tabs 48, 42, 50, which extend from the upper surface of the housing assembly. The tabs are connected to the chip 16 which is contained in the housing assembly in a manner described below. The chip 16 has an upper surface 18 on which there are two contact areas 20, 22, the contact area 20 being located in the center of the upper surface and the contact area 22 surrounding the contact area 20. The underside 24 of the chip constitutes a third contact area. Notches 14 are provided at each end of the heat sink 4 so that it can be fastened by screws to a panel member or the like.

The finished package 2 is produced by a series of manufacturing and assembly steps which are illustrated in FIG. 1. During these manufacturing steps, the chip, a substrate 90, the heat sink, and the housing assembly are assembled to an individual frame of the type shown in FIG. 5. These lead frames are produced in the form of a continuous strip 28, comprising spaced-apart parallel carrier strips 30, 32 to which the individual lead frames are connected at intervals along the length of the strip 28. Each lead frame comprises a flat chip supporting portion 34 which is centrally located between the carrier strips 30, 32. First, second, and third arms 36, 38, 40 respectively, are associated with the chip supporting portion 34. The second arm 38 is relatively short and extends from the chip supporting portion 34 towards one carrier strip 30. Arm 38 has a terminal tab 42 on its end which also extends normally towards the one carrier strip 30. The end 44 of the second tab 42 is chamfered or truncated, as shown, and is connected to the one carrier strip 30 by an integral connecting section 46. Tab 42 and the tabs 48, 50, described below, are formed of a double thickness of the sheet metal from which the strip is produced in a manner which is described below so that they will have the proper thickness for mating with standard sizes of quick disconnect terminals.

The chip supporting portion 34 is disposed between intermediate portions of the first and third arms 36, 38, the first arm 36 having an intermediate portion 56 which extends besides, and parallel to, the edge 57 of the chip supporting portion and towards the carrier strip 32. An adjacent portion 52 of arm 36 is enlarged and relatively wider than the portion 56 and is notched, as shown at 54, on its edge which is proximate to the chip supporting portion 34. The relatively wide portion 52 has a double thickness tab 48 on its end which extends, cantilever fashion, towards the carrier strip 32.

Arm 36 is reversely bent as shown at 58 and a contact arm portion 60 of the arm 36 extends obliquely over the chip supporting surface 34. The end of this contact arm portion 60 is of reduced width, as shown at 62, so that it can be soldered or otherwise electrically connected to the contact area 20 of a chip 16.

The third arm 40 is generally similar to the arm 36 in that its intermediate portion 68 extends parallel to the side edge 41 of the chip supporting surface 34 and it has an enlarged portion 64 extending towards the carrier strip 32. This enlarged portion 64 is notched as shown at 66 and it has the double metal thickness tab 50 on its end.

A reversely formed section 70 extends from the intermediate portion 68 of the arm 40 and a contact arm portion 72 extends obliquely towards the chip supporting portion 34, this contact arm portion having an enlarged contact end 74 so that it can be electrically connected to the contact area 22 of the chip. The enlarged contact portion 74 has a central opening 76 through which the reduced width contact tab 62 of the contact arm 60 extends.

The chip supporting portion 34 and the arms 36, 40 are centrally supported in the strip 28 by a support member 78 which extends normally from the carrier strip 32 towards the support portion 34. The end 80 of support member 78 extends laterally into the notches 64, 66 and edge portions of this enlarged end 80 are integral with the arms 36, 40 along weakened severing lines 86, 88. The chip supporting portion 34 is also integral with the enlarged end 80 along a severing line 84. The weakened connecting zones or lines 86, 88, 84 are produced by scoring the blank, as shown in the drawing, at the time of stamping the blank and these scored lines facilitate removal fo the lead frame 5 from the carrier strip 32 when the chip 16 is assembled to the lead frame and the lead frame is assembled to a housing 6.

FIG. 4 shows the flat blank from which the lead frame of the strip is manufactured with the parts of the blank being identified with the same reference numerals, differentiated by prime marks, as are used in foregoing description of the lead frame. The double thickness tab 42 is produced by forming portions of the blank inwardly towards the center of the blank while the double thickness tabs 48, 50 are produced by bending the free end sections of the blank through an angle of 180 degrees towards the carrier strip 30. FIG. 4 also shows offset portions in the arms 36, 40 which are formed to produce the contact arms 60, 72.

FIG. 1 shows the steps which are followed in producing completed package devices in accordance with the invention. It will be understood that lead frame strip 28 can be fed along a production line and the manufacturing and assembly steps shown in FIG. 1 can be carried out at successive stations on the production line.

The first step in producing the package device 2 is to solder the metallized areas 92 on the upper surface of a ceramic substrate 90 to the chip receiving portion 34 and to the arms 36, 40 of the lead frame. Electrically separate metallized areas 92 are provided on the upper surface of the substrate 90 so that there will be no electrical paths between the three terminal tabs of the lead frame. The substrate is also metallized on its underside so that it can be soldered to the surface of the metallic heat sink 4.

After the substrate has been soldered to the lead frame, the chip 16 is located on the chip supporting surface 34 with the contact areas 20, 22 in engagement with the ends 62, 74 of the contact arms 60, 72 and with the contact area 24 on the underside of the chip disposed on the chip supporting surface 34. This soldering operation can be carried out with an induction heating unit of the type described in application Ser. No. 857,955, now abandoned or by other suitable means.

Thereafter, the tabs 42, 48, 50 are bent upwardly and the heat sink 4 is positioned below the lead frame. The underside of the lead frame is then soldered to the heat sink. The carrier strip 32 is removed after soldering and the carrier strip 30 can be removed immediately before the tabs are bent upwardly. The supporting portion 78 and the carrier strip 32 can be separated from the chip support portion 34 and the arms 36, 40 by simply bending a portion of the carrier strip relative to the lead frame so that fracture occurs along the score lines 84, 86, 88.

Thereafter, the housing 6 is assembled to the lead frame and the heat sink 4. This housing may comprise a premolded thermoplastic member and a central opening 94 and having openings 96 extending therethrough which are dimensioned to permit passage of the tabs through the housing and receive the portions 52, 64 of the arms 36, 40. Finally, the well or central opening 94 is filled with a suitable potting material such as an epoxy resin.

I claim:

1. A continuous flat strip of stamped and formed lead frames, said strip being of the type comprising spaced-apart first and second carrier strips, said lead frames being integral with said carrier strips at regularly spaced inervals, each of said lead frames comprising a chip supporting portion which is between said carrier strips, and first, second, and third arms, each of said first and third arms having a contact portion which extends over said chip supporting portion, each of said arms having a terminal tab integral therewith which is dimensioned to be mated with a complementary terminal devide, each of said lead frames being characterized in that:

said second arm extends from said chip supporting portion towards said first carrier strip, said terminal tab of said second arm extending from said second arm to, and normally of, said first carrier strip and having an end which is adjacent to, and integral with, said first carrier strip, said first and third arms having intermediate portions which extend normally of said carrier strips, said chip supporting portion being between said intermediate portions of said first and third arms, said terminal tabs of said first and third arms extending parallel to each other and parallel to said terminal tab of said second arm, said terminal tabs of said first and third arms extending towards, and normally of, said second carrier strip, and, removable supporting means extending normally from said second carrier strip to, and removably connected at its end to, said chip supporting portion, said supporting means extending between said terminal tabs of said first and third arms, whereby, upon bending said terminal tabs of one of said lead frames normally of the plane of said strip in common direction, said tabs on said first and third arms will be in coplanar spaced-apart relationship and said tab on said second arm will define a plane which is parallel to, and spaced from, the plane of said first and third arms.

2. A continuous strip of stamped and formed lead frames as set forth in claim 1, and supporting means of each lead frame being removably connected at its end to said intermediate portions of said first and third arms.

3. A continuous strip of stamped and formed lead frames as set forth in claim 2, said supporting means of each lead frame being removably connected to said chip-supporting portion and to said intermediate portions of said first and third arms along frangible lines whereby said supporting means can be removed from said lead rrames upon fracture along said frangible lines.

4. A continuous strip of stamped and formed lead frames as set forth in claim 1, said contact portions of said first and third arms extending from said intermediate portions of said first and third arms at locations proximate to said first carrier strip.

* * * * *